United States Patent [19]

Kawakubo

[11] Patent Number: 5,760,411
[45] Date of Patent: Jun. 2, 1998

[54] ALIGNMENT METHOD FOR POSITIONING A PLURALITY OF SHOT AREAS ON A SUBSTRATE

[75] Inventor: Masaharu Kawakubo, Kanagawa-ken, Japan

[73] Assignee: Nikon Corporation, Tokyo, Japan

[21] Appl. No.: 720,177

[22] Filed: Sep. 25, 1996

[30] Foreign Application Priority Data

Sep. 29, 1995 [JP] Japan .................... 7-252807

[51] Int. Cl.$^6$ .................... H01L 21/78; G01B 11/26
[52] U.S. Cl. .................... 250/548; 356/401
[58] Field of Search .................... 250/548, 557, 250/237 G, 559.3; 356/363, 399, 400, 401; 355/53, 55

[56] References Cited

U.S. PATENT DOCUMENTS 5,118,953  6/1992  Ota et al. .................... 250/548
5,160,849  11/1992  Ota et al. .................... 250/548
5,561,606  10/1996  Ota et al. .................... 364/489

*Primary Examiner*—Que Le
*Assistant Examiner*—Kevin Pyo
*Attorney, Agent, or Firm*—Armstrong, Westerman, Hattori, McLeland & Naughton

[57] ABSTRACT

Two laser beams with a frequency difference are applied to a wafer mark on a wafer from an LIA (Laser Interferometric Alignment) system through a projection optical system, and diffracted light beams generated from the wafer mark are received by first to third light-receiving devices, respectively, in the LIA. The first light-receiving device receives first interference light comprising ±1st-order diffracted light beams (first processing mode). The second and third light-receiving devices respectively receive second and third interference lights comprising zeroth-order light and 2nd-order diffracted light (second processing mode). Alignment is effected by using either of the two processing modes which gives better measurement reproducibility.

10 Claims, 3 Drawing Sheets

5,760,411

ALIGNMENT METHOD FOR POSITIONING A PLURALITY OF SHOT AREAS ON A SUBSTRATE

BACKGROUND OF THE INVENTION

The present invention relates to an alignment method for positioning each shot area on a photosensitive substrate with respect to an exposure position in an exposure system used to transfer a mask pattern onto the photosensitive substrate in a photolithography process for producing, for example, semiconductor devices, imaging devices (e.g., CCDs), liquid crystal display devices, or thin-film magnetic heads. More particularly, the present invention relates to an alignment method in which each shot area is aligned on the basis of array coordinates calculated by statistical processing.

In production of semiconductor devices, e.g., very-large-scale integrated (VLSI) circuits, a projection exposure system (a stepper, etc.) is used in which a pattern formed on a reticle as a mask is projected onto each shot area on a photoresist-coated wafer through a projection optical system. In general, a semiconductor device is formed by stacking a multiplicity of layers of circuit patterns on a wafer with a predetermined positional relationship. Therefore, when a circuit pattern for the second or later layer is to be transferred onto each shot area on the wafer, it is necessary to carry out alignment of each shot area with respect to the reticle pattern projection position (exposure position), i.e., alignment of the wafer and the reticle, with high accuracy.

Among conventional wafer alignment methods for use in projection exposure systems, an enhanced global alignment (hereinafter referred to as "EGA") method is known as a method which provides high throughput (i.e., the number of wafers processed per unit time) and high alignment accuracy, as disclosed, for example, in U.S. Pat. No. 4,780,617 [Japanese Patent Application Unexamined Publication (KOKAI) No. 61-44429] and U.S. Pat. No. 4,833,621. In the EGA method, a predetermined number of shot areas (sample shots) are previously selected from among all shot areas on a wafer, and coordinate positions of wafer marks for alignment attached to the sample shots are detected through a predetermined alignment sensor. Then, the detected coordinates and other necessary data are subjected to statistical processing to thereby calculate array coordinates of all the shot areas, and each shot area is aligned on the basis of the calculated array coordinates.

As an alignment sensor used in the EGA method, an LIA (Laser Interferometric Alignment) sensor is known, as disclosed, for example, in U.S. Pat. No. 5,489,986 [Japanese Patent Application Unexamined Publication (KOKAI) No. 2-22760]. In the LIA sensor, a diffraction grating-shaped wafer mark is illuminated with a pair of coherent laser beams having slightly different frequencies. A pair of diffracted light beams generated in the same direction from the wafer mark are detected as a heterodyne beam and photoelectrically converted to obtain a beat signal, and the position of the wafer mark is detected on the basis of the phase of the beat signal. Among LIA sensors, one in which a wafer mark is illuminated with a pair of laser beams of slightly different frequencies, as described above, is also known as "two-beam heterodyne interference alignment sensor". There is another type of LIA sensor, i.e., a homodyne interference LIA sensor in which a wafer mark is illuminated with light beams of the same frequency, although it is not widely used.

A conventional LIA sensor uses a single monochromatic laser light source such as a He-Ne laser light source, or a plurality of monochromatic laser light sources. In general, two laser beams are symmetrically applied to a diffraction grating-shaped wafer mark from above it, and interference light comprising ±1st-order diffracted light beams generated by diffraction at the wafer mark upwardly at approximately right angles to the plane of the wafer mark is detected.

In a case where a single monochromatic laser light source is used in the above-described conventional LIA sensor, the sensor operation is likely to be affected by thin-film interference at the photoresist layer on the wafer. Therefore, in an LIA sensor wherein only ±1st-order diffracted light beams are received, as described above, the diffracted light intensity becomes weak depending upon the thickness of the photoresist layer and the size of height difference (step) between recessed and projecting portions of the wafer mark. Consequently, the amplitude of the photoelectrically converted signal (beat signal) finally obtained may be reduced, resulting in a reduction of the alignment accuracy.

To cope with the above-described problem, another conventional LIA sensor is designed to selectively use either of two different processing modes, that is, a first mode in which the sensor receives ±1st-order diffracted light beams generated by diffraction at the wafer mark, and a second mode in which the sensor receives interference light comprising zeroth-order light generated from one laser beam by reflection at the wafer mark and 2nd-order diffracted light generated from the other laser beam by diffraction at the wafer mark, as disclosed, for example, in U.S. Pat. No. 5,160,849. A wafer in an actual process has a dulling of wafer mark edges, deformation of wafer marks, variations in the thickness of the photoresist layer, etc. Therefore, there is no possibility that the intensities of both the former, or first, interference light and the latter, or second, interference light will reduce. When the intensity of the first interference light is weak, the intensity of the second interference light becomes strong, and vice versa. In other words, the use of either of the first and second modes makes it possible to obtain interference light having an intensity higher than a predetermined level under any circumstances.

When the intensities of both the first and second interference lights are higher than a predetermined level, either the first mode or the second mode may be selected, or an average value of a value obtained in the first mode and a value obtained in the second mode may be used. However, there has heretofore been no established technique of quantitatively judging which of the two modes, the first mode or the second mode, should be selected.

To reduce the effect of thin-film interference, an LIA sensor which uses laser beams of two different wavelengths has also been proposed, as disclosed, for example, in U.S. Pat. No. 5,118,953. For this type of LIA sensor also, two different systems are conceivable: one in which interference light generated from a laser beam of first wavelength and interference light generated from a laser beam of second wavelength are received with a single light-receiving element; and another in which the former interference light and the latter interference light are received with different light-receiving elements, respectively, and either of two beat signals thus obtained is selected. However, there has heretofore been no established technique of quantitatively judging which of the first and second wavelengths should be selected.

In view of the above-described circumstances, an object of the present invention is to provide an alignment method capable of obtaining high alignment accuracy, and more particularly an alignment method wherein, when alignment is effected by using an alignment sensor capable of detection in a plurality of different processing modes, it is possible to select a processing mode of highest accuracy under actual use conditions.

SUMMARY OF THE INVENTION

The alignment method according to the present invention is a method of aligning each of a plurality of shot areas on a substrate with respect to a reference position in a predetermined stationary coordinate system. The method has: the first step of selecting some of the plurality of shot areas as sample shots and of measuring the coordinate position of each of the selected sample shots in the stationary coordinate system by using each of a plurality of processing modes of a predetermined alignment system; the second step of calculating a dispersion of results of the measurement at the first step for each processing mode; the third step of selecting a processing mode in which the dispersion of the measurement results is the smallest from among the plurality of processing modes on the basis of results of the calculation at the second step; and the fourth step of aligning each of the plurality of shot areas on the substrate on the basis of the results of the measurement carried out at the first step in the processing mode selected at the third step.

In the above-described method, the second step may include the substeps of: 1) obtaining for each processing mode a non-linear positional error of each of the sample shots on the basis of the coordinate position measured at the first step; and 2) obtaining for each processing mode a dispersion of the non-linear positional errors of the sample shots as a dispersion of the results of the measurement at the first step.

In the above-described method, the alignment system may be an alignment system which applies two light beams of different frequencies to a grating-shaped mark formed on the substrate and receives at least one of a plurality of heterodyne beams emitted from the mark in different directions, thereby detecting the position of the mark, and the plurality of processing modes may be arranged to detect the position of the mark on the basis of respective heterodyne beams different from each other.

In the above-described method, the alignment system may be an alignment system which applies alignment light to a mark formed on the substrate and receives light from the mark, thereby detecting the position of the mark, and the plurality of processing modes may be arranged to illuminate the mark with alignment light of different wavelengths.

The above-described method may be such that, for a predetermined number of substrates from a first one of a plurality of substrates to be processed, each shot area is aligned by using the first to fourth steps, and for the following substrates, each shot area is aligned by using a processing mode which gives the smallest dispersion of results of measurement for the predetermined number of substrates.

The alignment method according to another aspect of the present invention has: the first step of measuring the position of each of a plurality of marks on a substrate by using each of a plurality of processing modes of a predetermined alignment system; the second step of calculating a dispersion of results of the measurement at the first step for each processing mode; the third step of selecting a processing mode in which the dispersion of the measurement results is the smallest from among the plurality of processing modes on the basis of results of the calculation at the second step; and the fourth step of aligning the substrate by using the processing mode selected at the third step from among the plurality of processing modes of the alignment system.

In the above-described method, the second step may include the substeps of: 1) obtaining for each processing mode a non-linear positional error of each of the marks on the basis of the position measured at the first step; and 2) obtaining for each processing mode a dispersion of the non-linear positional errors of the marks as a dispersion of the results of the measurement at the first step.

In the above-described method, the alignment system may be an alignment system which applies two light beams of different frequencies to a grating-shaped mark formed on the substrate and receives at least one of a plurality of heterodyne beams emitted from the mark in different directions, thereby detecting the position of the mark, and the plurality of processing modes may be arranged to detect the position of the mark on the basis of respective heterodyne beams different from each other.

In the above-described method, the alignment system may be an alignment system which applies alignment light to a mark formed on the substrate and receives light from the mark, thereby detecting the position of the mark, and the plurality of processing modes may be arranged to illuminate the mark with alignment light of different wavelengths.

The above-described method may be such that, for a predetermined number of substrates from a first one of a plurality of substrates to be processed, alignment is effected by using the first to fourth steps, and for the following substrates, alignment is effected by using a processing mode which gives the smallest dispersion of results of measurement for the predetermined number of substrates.

DETAILED DESCRIPTION OF PREFERRED EMBODIMENTS

One embodiment of the alignment method according to the present invention will be described below with reference to the accompanying drawings.

Figure 1:
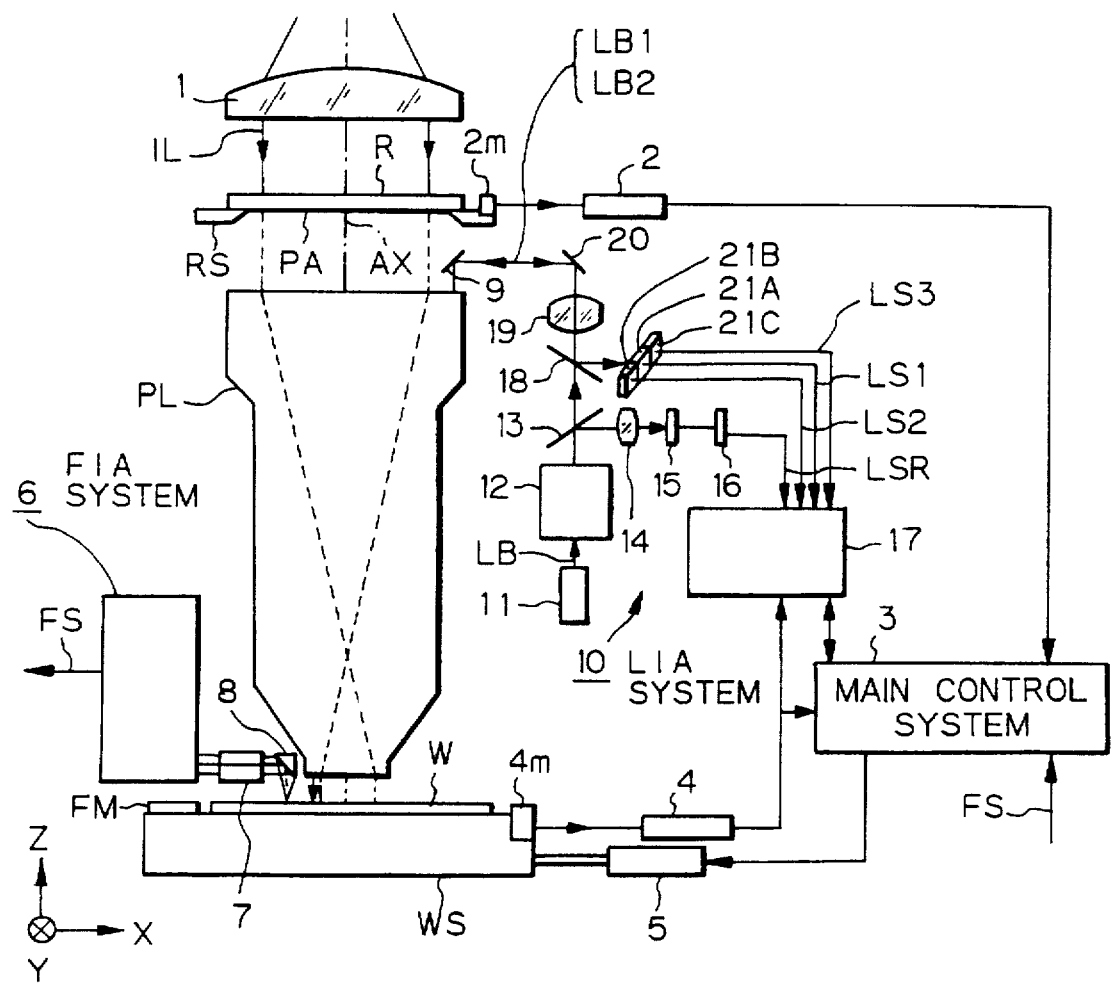
FIG. 1 shows the arrangement of a projection exposure system to which the alignment method according to the present invention is applied.

FIG. 1 schematically shows the arrangement of a stepper type projection exposure system to which the alignment method according to the present invention is suitably applied. Referring to FIG. 1, during exposure, illuminating light IL is generated in an illumination optical system body unit (not shown) and passes through a condenser lens 1 in the illumination optical system to illuminate a pattern area PA on a reticle R with an approximately uniform illuminance distribution. In this embodiment, the illuminating light IL for exposure is an emission line (g-line, i-line, etc.) of a super-high pressure mercury-vapor lamp. However, it is also possible to use emission lines from other lamps, laser light from excimer lasers (e.g., a KrF excimer laser, or an ArF excimer laser), or harmonics from a metal vapor laser or a YAG laser.

The reticle R in this embodiment has reticle marks as alignment marks formed on approximately central portions of the four sides of the pattern area PA surrounded by a light-blocking frame. Further, the reticle R has two alignment marks which are provided in the form of cross-shaped light-blocking marks on outer peripheral portions thereof so as to face each other. The two alignment marks are used for alignment of the reticle R (i.e., alignment with respect to an optical axis AX of a projection optical system PL).

The reticle R is placed on a reticle stage RS. The reticle stage RS is slightly movable in an imaginary plane perpendicular to the optical axis AX by a driving unit (not shown). The reticle stage RS is also two-dimensionally movable and slightly rotatable in a horizontal plane perpendicular to the optical axis AX. A moving mirror $2m$ is fixed on an end portion of the reticle stage RS to reflect a laser beam from a laser light wave interferometer (hereinafter referred to as "laser interferometer") 2. The two-dimensional position of the reticle stage RS is constantly detected by the laser interferometer 2 at a resolution of the order of 0.01 μm, for example. The result of the detection is supplied to a main control system 3 which controls operations of the whole system. The main control system 3 slightly moves the reticle stage RS on the basis of a measurement signal from a reticle alignment system (not shown) provided above the reticle R, thereby enabling the reticle R to be positioned so that the central point in the pattern area PA coincides with the optical axis AX.

During exposure, illuminating light IL passing through the pattern area PA on the reticle R enters the projection optical system PL, which is telecentric on both sides (or on only the wafer side). By the projection optical system PL, an image of a circuit pattern on the reticle R is projected (formed) over an already-formed chip pattern in one shot area on a wafer W as an image reduced to ⅕. The wafer W has a photoresist layer formed on a surface thereof and is held such that the resist-coated surface is approximately coincident with the best focus plane of the projection optical system PL. In the following description, a Z-axis is taken in a direction parallel to the optical axis AX of the projection optical system PL, and an X-axis is taken in a direction parallel to the plane of FIG. 1 in a plane perpendicular to the Z-axis. A Y-axis is taken in a direction perpendicular to the plane of FIG. 1.

The wafer W is held on a slightly rotatable wafer holder (not shown) by vacuum. The wafer holder is mounted on a wafer stage WS. Thus, the wafer W is held over the wafer stage WS through the wafer holder. The wafer stage WS is arranged to be two-dimensionally movable in a step-and-repeat manner by a driving unit 5. Upon completion of transfer exposure of the reticle R with respect to one shot area on the wafer W, the wafer stage WS is stepped to a subsequent shot position. A moving mirror $4m$ is fixed on an end portion of the wafer stage WS to reflect a laser beam from a laser interferometer 4. The X- and Y-coordinates of the wafer stage WS are constantly detected by the laser interferometer 4 at a resolution of the order of 0.01 μm, for example. A stage coordinate system (stationary coordinate system) (X,Y) of the wafer stage WS is determined by the X- and Y-coordinates measured by the laser interferometer 4 in this way. Measured values obtained from the laser interferometer 4 are supplied to the main control system 3 and also to an LIA signal processing system 17 (described later). The main control system 3 controls the position of the wafer stage WS through the driving unit 5 on the basis of the supplied measured value and other necessary data.

A fiducial member FM is provided on the wafer stage WS so as to be approximately flush with the surface of the wafer W. The fiducial member FM has predetermined fiducial marks used in measurement of a base line quantity and for other purposes. The base line quantity is the distance between the detection center of each alignment sensor and the exposure center (i.e., the optical axis AX of the projection optical system PL). It is assumed that the base line quantity of each alignment sensor (described later) has previously been measured through the fiducial member FM.

Further, an off-axis field image alignment (FIA) type alignment sensor (hereinafter referred to as "FIA system") 6 is provided at a side of the projection optical system PL. Illuminating light in a relatively wide band of wavelengths to which the photoresist layer does not react is generated in the FIA system 6 and applied through an objective lens 7 and a prism 8 to a mark to be detected on the wafer W at approximately right angles to the plane of the mark. Reflected light from the mark returns to the FIA system 6 through the prism 8 and the objective lens 7, and an image of the mark is formed on an index board in the FIA system 6. The mark image is relayed onto an imaging device, e.g., a two-dimensional CCD. An image signal FS from the imaging device in the FIA system 6 is supplied to the main control system 3 where the position (coordinate value) in the direction X or Y of the mark is calculated.

Next, an LIA type alignment sensor in this embodiment will be explained. A TTL (Through-The-Lens) and LIA type alignment sensor (hereinafter referred to as "LIA system") 10 for the Y-axis is disposed at a side of the top of the projection optical system PL. The LIA system 10 is herein briefly explained; a more specific arrangement of an LIA system is disclosed, for example, in Japanese Patent Application Unexamined Publication (KOKAI) No. 2-272305. In the LIA system 10, a laser beam LB emitted from a light source (e.g., a He-Ne laser light source) 11 enters a heterodyne beam generating optical system 12. The heterodyne beam generating optical system 12 includes two acousto-optic modulators and is arranged to take in the laser beam LB and to emit two laser beams LB1 and LB2 with a predetermined frequency difference $\Delta f$ therebetween in an approximately symmetric relation to each other with respect to the optical axis. The laser beams LB1 and LB2 are separate from each other in a plane perpendicular to the plane of FIG. 1.

The two laser beams emitted from the heterodyne beam generating optical system 12 reach a beam splitter 13. Two laser beams reflected by the beam splitter 13 pass through a lens system (inverse Fourier transformation lens) 14 and enter a reference diffraction grating 15 fixed on the system. The two laser beams are incident on the reference diffraction grating 15 from two directions different from each other at a predetermined angle of intersection to effect image formation (intersection). A light-receiving device 16, which is a photodiode or the like, receives interference light of diffracted light beams generated in approximately the same direction through the reference diffraction grating 15, and photoelectrically converts the received light. Thus, a sinusoidal reference beat signal LSR of frequency $\Delta f$ corresponding to the diffracted light intensity is obtained and supplied to the LIA signal processing system 17.

Meanwhile, two laser beams LB1 and LB2 passing through the beam splitter 13 pass a beam splitter 18 and are refracted through an objective lens 19 so as to intersect each other. Thereafter, the laser beams LB1 and LB2 are successively reflected by mirrors 20 and 9 to enter the projection optical system PL. The two laser beams LB1 and LB2 entering the projection optical system PL are converged in the shape of spots on the pupil plane of the projection optical system PL at respective positions which are approximately symmetric with respect to the optical axis AX. Thereafter, as shown in FIG. 2, the two laser beams LB1 and LB2 become bundles of parallel rays inclined at symmetric angles to each other with respect to the optical axis AX in the pitch direction (direction Y) of a diffraction grating-shaped wafer mark for the Y-axis on the wafer W and are incident on the wafer mark from two directions different from each other at a predetermined angle of intersection.

Figure 2:
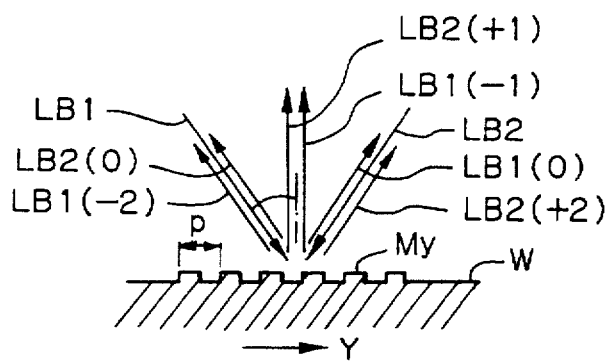
FIG. 2 illustrates the detecting principle of an LIA system.

FIG. 2 shows the way in which the laser beams LB1 and LB2 intersect each other on the wafer W. Referring to FIG. 2, a wafer mark My for the Y-axis is a diffraction grating-shaped mark comprising recesses and projections alternately formed in the direction Y at a pitch p. The laser beams LB1 and LB2 are symmetrically incident on the wafer mark My at an incident angle $\phi$. The relationship between the wavelength $\lambda$, pitch p and incident angle $\phi$ of the laser beams LB1 and LB2 has been determined such that −1st-order diffracted light beam LB1(−1) generated from the laser beam LB1 by diffraction at the wafer mark My and +1st-order diffracted light beam LB2(+1) generated from the laser beam LB2 by diffraction at the wafer mark MY are emitted upwardly at right angles to the plane of the wafer mark My. In this case, zeroth-order light (regularly reflected light) LB1(0) generated from the laser beam LB1 by reflection at the wafer mark My and +2nd-order diffracted light LB2(+2) generated from the laser beam LB2 by diffraction at the wafer mark My are emitted as interference light in parallel to the direction of incidence of the laser beam LB2. Zeroth-order light (regularly reflected light) LB2(0) generated from the laser beam LB2 by reflection at the wafer mark My and −2nd-order diffracted light LB1(−2) generated from the laser beam LB1 by diffraction at the wafer mark My are emitted as interference light in parallel to the direction of incidence of the laser beam LB1. In this embodiment, therefore, the projection exposure system is provided with two processing modes: a first processing mode in which the position detection of the wafer mark My is effected on the basis of interference light (heterodyne beam) comprising ±1st-order diffracted light beams LB1(±1) and LB2(+1); and a second processing mode in which wafer mark position detection is effected on the basis of interference light comprising zeroth-order light LB1(0) and +2nd-order diffracted light LB2(+2) and interference light comprising zeroth-order light LB2(0) and −2nd-order diffracted light LB1(−2). Thus, position detection is effected in the optimal processing mode selected according to each individual process.

Referring to FIG. 1, three interference lights generated from a wafer mark for the Y-axis on the wafer W travel via the projection optical system PL, the mirror 9, the mirror 20, the objective lens 19 and the beam splitter 18 and are received by light-receiving devices 21A to 21C, respectively. The light-receiving devices 21A, 21B and 21C photoelectrically convert the incident interference lights to obtain sinusoidal wafer beat signals LS1, LS2 and LS3 of frequency $\Delta f$ and output these signals to the LIA signal processing system 17. In this case, the central light-receiving device 21A receives first interference light comprising ±1st-order diffracted light beams LB1(−1) and LB2(+1). The light-receiving device 21B receives second interference light comprising zeroth-order light LB1(0) and +2nd-order diffracted light beam LB2(+2). The light-receiving device 21C receives third interference light comprising zeroth-order light LB2(0) and −2nd-order diffracted light beam LB1(−2). Accordingly, in the first processing mode, the LIA signal processing system 17 detects the Y-coordinate of a wafer mark to be measured from the phase difference between the wafer beat signal LS1 and the reference beat signal LSR, together with the measured value obtained from the laser interferometer 4. In the second processing mode, the LIA signal processing system 17 detects the Y-coordinate of the wafer mark from an average value of phase differences between the reference beat signal LSR and the wafer beat signals LS2 and LS3, for example, together with the measured value from the laser interferometer 4. The detected Y-coordinate is supplied to the main control system 3.

The projection exposure system shown in FIG. 1 is also provided with an LIA system (not shown) for the X-axis which is adapted to detect the position of a wafer mark for the X-axis.

The following is an explanation of operations taking place in this embodiment when alignment is effected for each shot area on a wafer to be exposed by the EGA method, and a pattern image of the reticle R is projected onto each shot area by exposure light. First, a wafer W to be exposed is loaded onto the wafer stage WS shown in FIG. 1.

Figure 3:
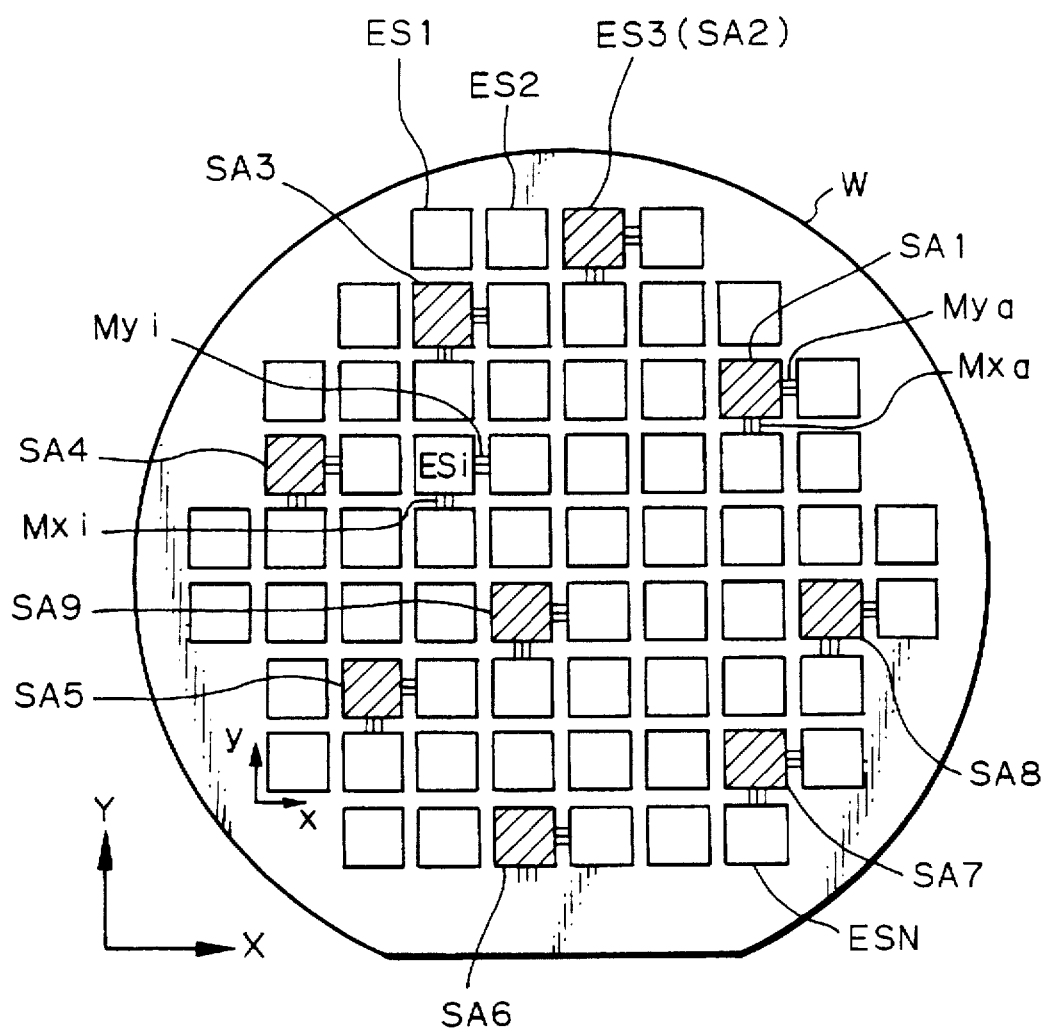
FIG. 3 is a plan view showing an array of shot areas on a wafer which is exposed in one embodiment of the present invention.

FIG. 3 shows an array of shot areas on the wafer W. Referring to FIG. 3, the wafer W has shot areas ES1, ES2, . . . , ESN regularly formed thereon along a coordinate system (x,y) set on the wafer W. Each shot area ESi has a chip pattern already formed by the preceding processes. Each shot area ESi is divided from others in the directions x and y by street lines of a predetermined width. Each shot area ESi is provided with a wafer mark Mxi for the X-axis which is formed as an alignment mark in the center of the neighboring street line extending in the direction x, and further provided with a wafer mark Myi for the Y-axis which is formed in the center of the neighboring street line extending in the direction y. The wafer mark Mxi for the X-axis is a diffraction grating-shaped mark comprising recesses and projections alternately formed in the direction x at a pitch p (see FIG. 2). Similarly, the wafer mark Myi for the Y-axis is a diffraction grating-shaped mark comprising recesses and projections alternately formed in the direction y at a pitch p.

First, search alignment of the wafer W is effected by using, for example, the FIA system 6 shown in FIG. 1 as rough wafer alignment. Thereafter, as shown in FIG. 3, for nine sample shots SA1 to SA9 previously selected from all the shot areas on the wafer W, the coordinates in the stage coordinate system (X,Y) of the wafer marks attached to each sample shot are measured by using the LIA system 10 for the X-axis, shown in FIG. 1, and the LIA system for the Y-axis. More specifically, for the sample shot SA1, for example, the X-coordinate of the wafer mark Mxa and the Y-coordinate of the wafer mark Mya are measured. In this embodiment, each LIA system is provided with two processing modes. At this stage, however, the coordinates of each wafer mark are measured in both the first and second processing modes. The measured coordinates of each wafer mark are supplied to the main control system 3. It should be noted that in the following description the coordinates of the wafer marks attached to each sample shot are regarded as the coordinates of the sample shot.

Next, the main control system 3 quantitatively determines the size of a dispersion of the results of measurement in each of the first processing mode (in which ±1st-order diffracted light is detected) and the second processing mode (in which zeroth-order light and 2nd-order diffracted light are detected). For this purpose, first, the coordinate values of the n th (n=1 to 9) sample shot measured in the former, i.e., first processing mode are assumed to be $(XM_n, YM_n)$. A linear transformation model for calculating coordinate values (X,Y) in the stage coordinate system (X,Y) from coordinate values (x,y) in the coordinate system (x,y) set on the wafer W is expressed as shown below by using six transformation parameters a to f. The following transformation parameters a to f are the functions of the residual rotation error θ of the wafer, the perpendicularity error w of the shot array, the linear expansion and contraction (scaling) Rx and Ry of the wafer, and the offset (translation) Ox and Oy of the wafer.

$$\begin{bmatrix} X \\ Y \end{bmatrix} = \begin{bmatrix} a & b \\ c & d \end{bmatrix} \begin{bmatrix} x \\ y \end{bmatrix} + \begin{bmatrix} e \\ f \end{bmatrix} \quad \text{Eq. 1}$$

The six transformation parameters a to f in the above transformation expression are determined by the least square approximation as follows: Assuming that coordinate values calculated on the basis of Eq. 1 from the known design coordinate values of the n th sample shot SAn are $(X_n, Y_n)$, the residual error component is expressed by $$\text{Residual error component} = \sum_{n=1}^{m} \{(X_n - XM_n)^2 + (Y_n - YM_n)^2\} \quad \text{Eq.2}$$

where m is 9 in the example shown in FIG. 3.

The values of the transformation parameters a to f in Eq. 1 are determined such that the residual error component reaches a minimum. This is EGA calculation. Next, computational array coordinate values $(X_n, Y_n)$ of the n th sample shot, calculated by using the transformation parameters a to f thus obtained, are subtracted from the measured coordinate values $(XM_n, YM_n)$ of the n th sample shot, thereby obtaining non-linear error quantities (δXi,δYi) in array errors of all the sample shots SAi (i=1 to 9). The non-linear error quantities may be regarded as random components in the measured values.

Figure 4:
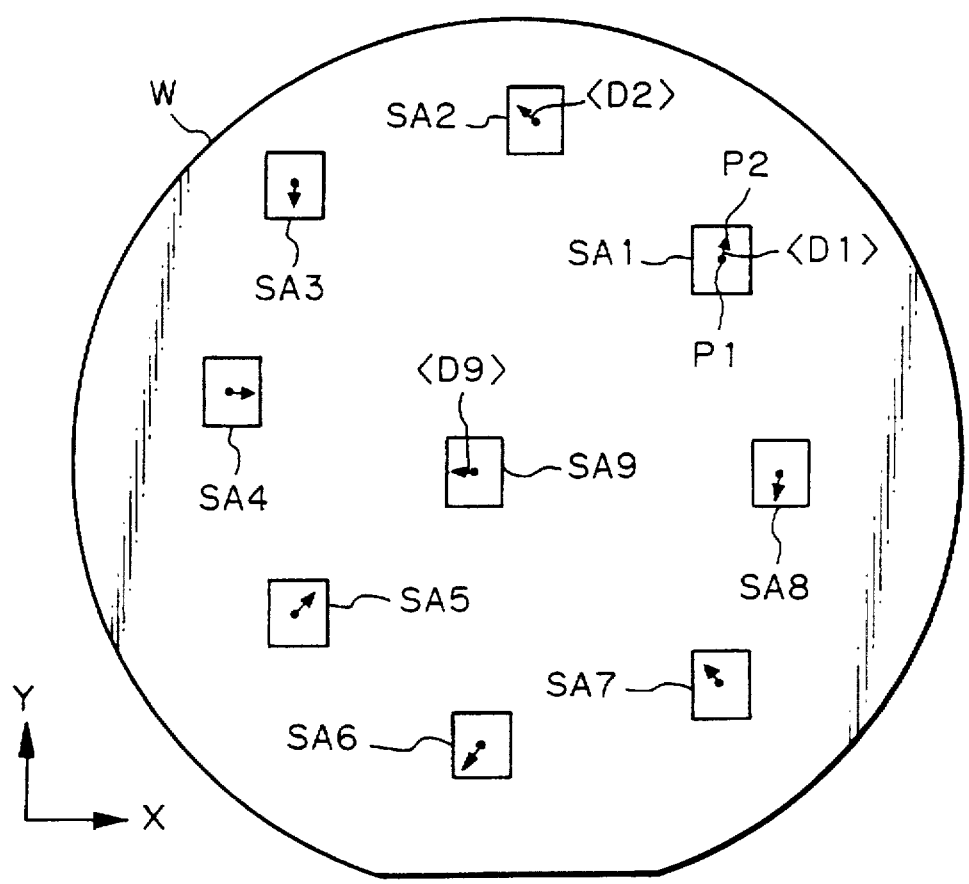
FIG. 4 is a plan view showing non-linear error vectors of sample shots on the wafer shown in FIG. 3.

FIG. 4 exaggeratedly shows one example of non-linear error quantities at the sample shots SA1 to SA9 on the wafer W shown in FIG. 3. In FIG. 4, a non-linear error quantity at the sample shot SA1 is expressed by a non-linear error vector <D1>. The starting point P1 of the non-linear error vector <D1> indicates the computational coordinate values (coordinate values containing linear error quantities) of the sample shot SA1. The end point P2 of the vector <D1> indicates the measured coordinate values of the sample shot SA1. The X-component of the vector <D1> is δXi and the Y-component thereof is δYi. Similarly, non-linear error quantities at the other sample shots SA2 to SA9 are expressed by respective vectors <D2> to <D9>.

Thereafter, the main control system 3 in this embodiment determines the square of a standard deviation of 18 components comprising the X- and Y-components of the vectors <D1> to <D9> representing the non-linear error quantities at the sample shots SA1 to SA9, that is, a variance V1. The variance V1 is regarded as the dispersion of the results of measurement in the first processing mode of the LIA system.

Next, the coordinate values of the sample shots SA1 to SA9 measured in the second processing mode of the LIA system are similarly subjected to the EGA calculation to determine values of the transformation parameters a to f in Eq. 1. Thereafter, a variance V2 of non-linear error quantities of the measurement results at the sample shots SA1 to SA9 is determined by using the determined values of the transformation parameters a to f. The variance V2 is regarded as the dispersion of the results of measurement in the second processing mode of the LIA system. Then, the main control system 3 makes a size comparison between the two variances V1 and V2, and decides to effect alignment according to either of the two processing modes which gives a smaller variance. This is because a processing mode which gives a small variance of non-linear error quantities (random quantities) is a mode in which an LIA type alignment sensor provides favorable measurement reproducibility. The reason for this is as follows: In the measuring method according to this embodiment, the same wafer marks are measured under the same conditions; therefore, factors other than the random components, which represent the measurement reproducibility of the alignment sensor, are the same in the two processing modes. In other words, the magnitude of the variance of the random components is determined by the measurement reproducibility in each processing mode of an LIA type alignment sensor.

If V1<V2 holds, for example, the first processing mode is selected, and computational array coordinates of each shot area ESi (i=1 to N) on the wafer W in FIG. 3 are determined from Eq. 1 by using the values of the transformation parameters a to f obtained in the first processing mode and the design array coordinates for each shot area ESi. Thereafter, the main control system 3 corrects the thus calculated array coordinates on the basis of the base line quantity, thereby obtaining computational coordinate values, and successively positions the shot areas ESi through the wafer stage WS. Then, a pattern image of the reticle R is transferred by exposure to each shot area Esi.

Thus, according to this embodiment, the first and second processing modes are quantitatively compared in terms of measurement reproducibility by the magnitude of the variance of non-linear error components (random components) of the measurement results, and either of the two processing modes which is better than the other in terms of measurement reproducibility is selected. Accordingly, alignment can be effected with higher accuracy.

Further, a wafer beat signal obtained from ±1st-order diffracted light beams and a wafer beat signal from zeroth-order light and 2nd-order diffracted light are simultaneously and continuously taken in and processed. Therefore, the reduction of the throughput can be held to an extremely small value in comparison to a case where alignment is effected by using only either of the two processing modes from the beginning.

Although in the above-described embodiment the variance of non-linear error components is used as the dispersion of the results of the measurement, it should be noted that it is also possible to use other quantities as the dispersion of the measurement results, for example, a value (3σ) which is triple the standard deviation of absolute values, or the range (i.e., the difference between the maximum and minimum values) of the X-components of the non-linear error components.

Although in the foregoing embodiment a variance is obtained by equally handling the X- and Y-components of the non-linear error quantities at the sample shots, the arrangement may also be such that a variance of the X-components of the non-linear error quantities at the sample shots and a variance of the Y-components thereof are independently determined, and the following two processing modes are independently selected: a processing mode which is most suitable for a case where the direction of the X-axis is determined to be a measuring direction; and a processing mode which is most suitable for a case where the direction of the Y-axis is determined to be a measuring direction.

Quantities which depend on each particular process, e.g., dulling of wafer mark edges, deformation of wafer marks, variations in the thickness of the photoresist layer, etc., are likely to be approximately uniform in the same lot. Therefore, alignment may be effected as follows: For example, for the top wafer or several wafers from the top in one lot, alignment is effected by using both the first and second processing modes, and the following wafers are aligned by using only one processing mode which is judged to be optimal by the results obtained so far, i.e., a processing mode in which the dispersion of the measurement results has been small on the average and the measurement reproducibility has been favorable. By doing so, the computing time can be shortened.

Although the LIA system 10 in the foregoing embodiment uses a monochromatic laser beam LB, the arrangement may be such that two different monochromatic laser beams, for example, are used to generate a pair of heterodyne beams from each monochromatic laser beam, and ±1st-order diffracted light beams from a wafer mark are detected for each pair of heterodyne beams. In this case, assuming that a mode which uses a first wavelength of the two wavelengths is defined as a first processing mode, and a mode which uses a second wavelength of the two wavelengths is defined as a second processing mode, the dispersion of the non-linear error components of the measurement results can be used as a criterion of judgment as to which of the two modes should be used, as is the case with the above-described embodiment.

The present invention can be applied not only to processes using LIA type alignment sensors but also to processes using alignment sensors that have a plurality of processing modes, to make a judgment as to which processing mode should be selected.

According to the present invention, measurement reproducibility in each of a plurality of processing modes is quantitatively evaluated from the dispersion of results of measurement, and a processing mode in which the measurement reproducibility is the best is used. Therefore, it is possible to select a processing mode of the highest accuracy under actual use conditions. As a result, high alignment accuracy can be obtained.

In the present invention, statistical processing is executed to obtain linear parameters for calculating array coordinates of a plurality of shots for measurement, measured with an alignment sensor, from the design array coordinates of the shots for measurement and to calculate actual array coordinates of a plurality of shot areas from the linear parameters and the design array coordinates of the shot areas. Accordingly, in a case where a processing mode which gives the smallest dispersion of non-linear components of measurement results is selected from among a plurality of processing modes, alignment, e.g., EGA, can be executed by using a processing mode of the highest accuracy.

Further, it is possible to quantitatively optimize a processing mode based on the LIA method in a case where the alignment sensor is a sensor which applies two coherent light beams to a diffraction grating-shaped mark for alignment attached to each shot for measurement on a substrate and receives a pair of diffracted light beams emitted from the mark for alignment in each of a plurality of different directions, and the plurality of processing modes are processing modes each arranged to detect the position of the mark for alignment from a photoelectrically converted signal obtained from a pair of diffracted light beams emitted in each of the plurality of different directions. Further, there is almost no reduction of the throughput because the plurality of processing modes can be executed approximately in parallel.

Similarly, it is possible to quantitatively optimize a processing mode based on the LIA method in a case where the alignment sensor is a sensor which applies a plurality of pairs of coherent light beams of different wavelengths to a diffraction grating-shaped mark for alignment attached to each shot for measurement on a substrate and receives a plurality of pairs of diffracted light beams of different wavelengths emitted from the mark for alignment in the same directions, respectively, and the plurality of processing modes are arranged to detect the position of the mark for alignment from respective photoelectrically converted signals obtained from the plurality of pairs of diffracted light beams of different wavelengths.

In a case where, in a group of a plurality of substrates to be processed, a predetermined number of substrates from the top are subjected to measurement by using the plurality of processing modes, and the following substrates are subjected to measurement by using a processing mode which is judged to be one in which the dispersion of measurement results is the smallest by the measurement executed so far, the group of substrates can be aligned with high accuracy as a whole without substantially reducing the throughput.

It should be noted that the present invention is not necessarily limited to the above-described embodiment, but may adopt various arrangements without departing from the gist of the present invention.

What is claimed is:

1. A method of aligning each of a plurality of shot areas on a substrate with respect to a reference position in a predetermined stationary coordinate system, said method comprising:

the first step of selecting some of said plurality of shot areas as sample shots and of measuring a coordinate position of each of said selected sample shots in said stationary coordinate system by using each of a plurality of processing modes of a predetermined alignment system;

the second step of calculating a dispersion of results of the measurement at said first step for each processing mode;

the third step of selecting a processing mode in which said dispersion of the measurement results is the smallest from among said plurality of processing modes on the basis of results of the calculation at said second step; and the fourth step of aligning each of said plurality of shot areas on said substrate on the basis of the results of the measurement carried out at said first step in the processing mode selected at said third step.

2. A method according to claim 1, wherein said second step includes the substeps of:

obtaining for each processing mode a non-linear positional error of each of said sample shots on the basis of the coordinate position measured at said first step; and obtaining for each processing mode a dispersion of the non-linear positional errors of said sample shots as a dispersion of the results of the measurement at said first step.

3. A method according to claim 1, wherein said alignment system applies two light beams of different frequencies to a grating-shaped mark formed on said substrate and receives at least one of a plurality of heterodyne beams emitted from said mark in different directions, thereby detecting a position of said mark, and said plurality of processing modes are arranged to detect a position of said mark on the basis of respective heterodyne beams different from each other.

4. A method according to claim 1, wherein said alignment system applies light for alignment to a mark formed on said substrate and receives light from said mark, thereby detecting a position of said mark, and said plurality of processing modes are arranged to illuminate said mark with light for alignment of different wavelengths.

5. A method according to claim 1, wherein, for a predetermined number of substrates from a first one of a plurality of substrates to be processed, each shot area is aligned by using said first to fourth steps, and for the following substrates, each shot area is aligned by using a processing mode which gives the smallest dispersion of results of measurement for said predetermined number of substrates.

6. A method of aligning a substrate, said method comprising:

the first step of measuring a position of each of a plurality of marks on said substrate by using each of a plurality of processing modes of a predetermined alignment system;

the second step of calculating a dispersion of results of the measurement at said first step for each processing mode;

the third step of selecting a processing mode in which said dispersion of the measurement results is the smallest from among said plurality of processing modes on the basis of results of the calculation at said second step; and the fourth step of aligning said substrate by using the processing mode selected at said third step from among said plurality of processing modes of said alignment system.

7. A method according to claim 6, wherein said second step includes the substeps of:

obtaining for each processing mode a non-linear positional error of each of said marks on the basis of the position measured at said first step; and obtaining for each processing mode a dispersion of the non-linear positional errors of said marks as a dispersion of the results of the measurement at said first step.

8. A method according to claim 6, wherein said alignment system applies two light beams of different frequencies to a grating-shaped mark formed on said substrate and receives at least one of a plurality of heterodyne beams emitted from said mark in different directions, thereby detecting a position of said mark, and said plurality of processing modes are arranged to detect a position of said mark on the basis of respective heterodyne beams different from each other.

9. A method according to claim 6, wherein said alignment system applies light for alignment to a mark formed on said substrate and receives light from said mark, thereby detecting a position of said mark, and said plurality of processing modes are arranged to illuminate said mark with light for alignment of different wavelengths.

10. A method according to claim 6, wherein, for a predetermined number of substrates from a first one of a plurality of substrates to be processed, alignment is effected by using said first to fourth steps, and for the following substrates, alignment is effected by using a processing mode which gives the smallest dispersion of results of measurement for said predetermined number of substrates.

* * * * *